Oct. 29, 1968

A. G. JORDAN 3,408,600

TUNED AMPLIFIER EMPLOYING UNIJUNCTION TRANSISTOR BIASED IN NEGATIVE RESISTANCE REGION

Filed March 10, 1961

WITNESSES

Leon J. Jaga

Gordon H. Telfer

INVENTOR

Angel G. Jordan

BY

Frederick Shapoe

ATTORNEY

United States Patent Office 3,408,600

Patented Oct. 29, 1968

3,408,600

TUNED AMPLIFIER EMPLOYING UNIJUNCTION TRANSISTOR BIASED IN NEGATIVE RESISTANCE REGION

Angel G. Jordan, Pittsburgh, Pa., assignor to Westinghouse Electric Corporation, East Pittsburgh, Pa., a corporation of Pennsylvania Filed Mar. 10, 1961, Ser. No. 94,868
1 Claim. (Cl. 333—80)

This invention relates generally to circuits employing semiconductor devices and more particularly to circuits employing semiconductor devices as an inductance.

It is known to the prior art that certain semiconductor devices exhibit inductive effects. An ordinary p-n junction biased in the forward direction so as to draw comparatively high current densities is such a device. Conductivity modulation results, for example, by the injection of many holes in to the n-type region requiring that electrons must be introduced through the ohmic contact on the n region to maintain charge neutrality. Hence, the conductivity of the region is modulated by the injected carriers. Since a delay occurs in this process due to the time required by injected minority carriers to travel in the region, an inductive effect occurs.

Unfortunately, the forward biased p-n junction has an appreciable resistance associated with its inductance which makes its Q low since $Q=L\omega/R$, where L is the inductance, $\omega$ the angular frequency and R the resistance. At high frequencies, the Q is even lower since the resistance increases with increasing frequency. Since an inductance with a low Q is not very practical, efforts have been made to compensate for the high positive resistance of the forward biased p-n junction. These efforts include the use of a negative resistance device in series with the forward biased junction for compensating for most of the positive resistance of the junction. Also, such devices as the avalanche transistor and the four layer switch, which include both forward biased junctions and negative resistances, have been used. While these devices and combinations thereof can simulate a high Q inductance, problems of instability and noise are often encountered, probably due to the fact that they have to be operated in the avalanche region with heat production as a result of the avalanche mechanism. If measures are taken to compensate for these disadvantages, the device becomes costly and impractical.

In addition, greater simplicity and ease in fabrication is desirable. For example, in the four-layer switch and the avalanche transistor, one region adjacent a forward biased junction is subjected to conductivity modulation and exhibits an inductance while another region adjacent a reverse biased junction becomes a region of negative resistance upon breakover of the reverse biased junction. Therefore at least two junctions and three regions are necessary and the desired effects are provided by two separate regions.

It is therefore an object of the present invention to provide an improved, high Q inductance using semiconductor elements.

Another object is to provide a semiconductor high Q inductance having a high degree of stability and low noise production.

Another object is to provide a semiconductor high Q inductance which is easily fabricated and which provides more than one function in a single semiconductive region, hence requiring only a small size.

According to the present invention, circuit combinations are provided for use as a high Q inductance including a semiconductor device providing an inductive effect and a negative resistance in a single multi-functional region. One such device is the unijunction transistor, also known as the double base diode, which provides a high Q inductance when biased into the negative resistance region of its current-voltage characteristic, in combination with means having a positive resistance of a magnitude approximately equal to the negative resistance of the unijunction transistor.

According to other features of the invention, circuits are provided employing a high Q inductance as above described.

The features of the present invention which are believed to be novel are set forth with particularity in the appended claims. The present invention, both as to its organization and manner of operation, together with the above mentioned and further objects and advantages thereof, may best be understood by reference to the following description, taken in connection with the accompanying drawings, in which:

Figure 1:
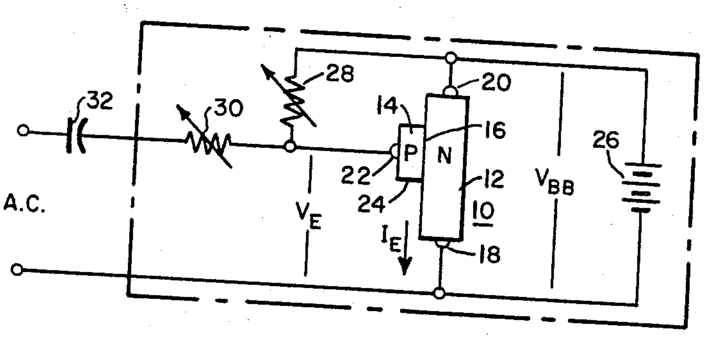
FIGURE 1 is a circuit diagram of a combination of elements providing a high Q inductance at its terminals in accordance with the present invention.

Referring now to FIG. 1, there is shown a semiconductor device 10 and associated elements which in circuit combination achieve the simulation of a high Q inductance. The semiconductor device 10 is one which exhibits an inductive effect and a negative resistance within the same multi-functional semiconductive region 12. The device 10 shown is a particular example of devices having the desired negative resistance and inductance characteristic and is well known in the art as a unijunction transistor. It is also known as a double base diode. As is well known, the unijunction transistor comprises a first semiconductive region 12 and a second semiconductive region 14 between which there is a rectifying junction 16. The first semiconductive region 12 is provided with first and second ohmic contacts 18 and 20, also called base contacts, and the second semiconductive region 14 is provided with an ohmic contact 22, the combination of which, 14 and 22, is also referred to as the emitter 24. Generally, the first semiconductive region 12, which is also referred to as the base, has a bar-like configuration and the ohmic contacts 18 and 20 are disposed at its opposite extremities with the emitter 24 disposed intermediate the extremities, its exact location depending on the desired characteristics of the device.

Figure 2:
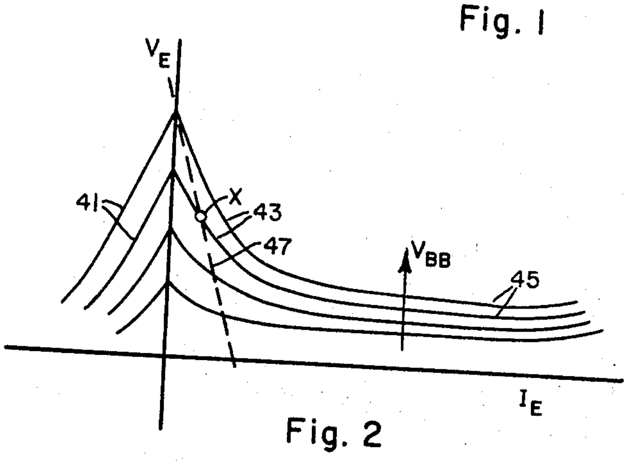
FIG. 2 is a set of curves which are typical of the voltage-current characteristic of unijunction transistors.

It is known that the unijunction transistor exhibits a characteristic like that shown in the family of curves in FIG. 2 wherein the ordinate is voltage drop between the emitter 24 and the first base contact 18, $V_E$, and the abscissa represents the current entering the emitter 24, $I_E$. The family of curves in FIG. 2 is produced by variation of the voltage between the two base contacts, $V_{BB}$. For a p-n device, the second base contact 20 is at a potential more positive than the first base contact 18 and the emitter 24 is at some intermediate potential. Each of the curves exhibits a region of ordinary resistance 41, in which the voltage drop increases with increasing current, a region of negative resistance 43 in which the voltage drop decreases for increasing current, and a valley 45 in which substantial current increase occurs without appreciable change in voltage drop. The negative resistance results from conductivity modulation of the base region 12 due to injection of minority carriers from the emitter 24 and electrons introduced through the ohmic contact 18 on the base. The more carriers that are injected in the region between the emitter 24 and the base contact 18, the more conductive the region 12 becomes and hence a dynamic negative resistance arises. As indicated by the curves, the negative resistance region 43 exists only when there is a net current from the emitter 24 into the base 12 which is not so large that saturation of the region occurs, which is the case when the valley 45 of the curves is reached. The field between the base contacts 18 and 20 sweeps injected carriers (holes in a p-n device) toward the contact 18 and since they are minority carriers they need a finite time to travel from the junction 16 to the base contact 18 or to points of recombination, if recombination occurs. Therefore, inductive effects will take place in the single semiconductive region 12 which are actually due to the same phenomenon that causes the negative resistance, i.e., the injection of carriers from the emitter.

This inductive effect is not the same as that which occurs in ordinary forward biased p-n junctions because, due to the applied voltage between the base contacts 18 and 20, the inductance here is greater when not too many carriers are injected into the base 12. The magnitude of the voltage between the base contacts 18 and 20 provides a means of controlling the inductance. This results due to the fact that the greater the field is the faster the carriers injected at the emitter are swept to the base contact 18, hence minimizing the inductive effect.

In FIG. 1, a direct current potential source 26 is applied across the base contacts 18 and 20 and a direct current potential is also applied between the emitter 24 and the first base contact 18 to establish parameters for the selection of an operating point in the negative resistance region 43 of the characteristic curve. The particular bias means shown in FIG. 1 is preferable because only one direct current source is employed. A bias resistor 28, having resistance $R_E$, is selected so that the emitter current, $I_E$, will not be too large, that is, to provide negative resistance. Bias resistor 28 may be variable, as shown, for tuning. The dotted line 47 shown on FIG. 2 is a typical load line resulting from the proper selection of the various parameters and a suitable operating point X may be selected in the negative resistance region 43.

In order to provide a high Q inductance, a compensating resistor 30, having resistance $R_p$, is provided in series with the emitter 24. The magnitude of $R_p$ is approximately equal to the negative resistance of the unijunction transistor 10 but is preferably variable so that it may be made slightly greater or slightly less than the negative resistance. In this manner, control of the Q of the inductance over a relatively wide range is possible.

Also shown in FIG. 1 is a blocking capacitor 32 having capacitance $C_B$, which may not be necessary but may be used to prevent any direct current from appearing at the AC terminals.

As a typical example of the operation of a unijunction transistor as a high Q inductance, a unijunction transistor was connected as shown in FIG. 1 with approximate component values selected as follows: a commercially available p-n type unijunction transistor was used with $V_{BB}=20$ volts
$R_E=50\times10^3$ ohms, $I_E=0.2\times10^{-3}$ amps
$R_p=25\times10^3$ ohms and $C_B=1$ microfarad An inductance of 1.5 millihenries was the result. It will, of course, be understood that the foregoing values are not restricting for they may be readily varied within broad ranges by persons skilled in the art (in accordance with the semiconductive material used, the dimensions of the device and other factors) so that the necessary conditions in accordance with this invention are obtained.

It should be noted that there are certain obvious modifications which may be made in the configuration of FIG. 1. For example, the base contacts 18 and 20 need not be disposed exactly opposite each other but may be located in other positions so long as there is provided a sweeping field across the junction. Biasing may be effected by other means such as the use of more than one potential source. The choice of using a p-n or an n-p unijunction transistor will not in most applications, make much difference. Of course, opposite polarities are used with an n-p device from those shown. It is possible that the choice may be somewhat significant as where an n-p type device in which electrons are injected into the base will probably have a lower inductance than a p-n type in which holes are injected due to the generally greater mobility of electrons. Devices of either silicon, germanium or an intermetallic III–V compound may be used in accordance with this invention.

Figure 3:
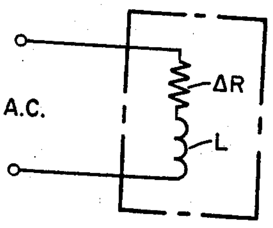
FIG. 3 is an approximate equivalent circuit, using conventional symbols of the circuit of FIG. 1.

In FIG. 3, there is shown within the dotted line the approximate equivalent circuit in conventional symbols of the semiconductor circuit shown within the dotted line of FIG. 1. That is, there is in effect provided between the AC terminals an inductance in series with a resistance, where the resistance, ΔR, is the net resistance by algebraically adding the positive resistance of the compensating resistor 30 ($R_p$) and the negative resistance of the unijunction transistor 10 (−R). As specified, ΔR approaches zero resulting in a high Q inductance. It should be noted that the equivalent circuit of FIG. 3 is approximately valid for the circuit of FIG. 1 for small AC signals, that is, for AC signals having a peak-to-peak amplitude which is small compared to the DC bias. It should also be noted that in conventional applications of unijunction transistors, AC signals are used which are not small compared with the DC levels.

Figure 4:
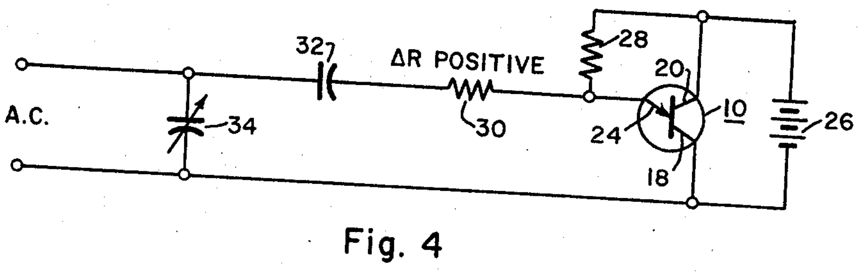
FIG. 4 is a circuit diagram of a circuit combination employing the inductive component of FIG. 1.

By adjusting the compensating resistor 30 various different useful circuits can be provided using the inductance component of FIGURE 1. For example, if the compensating resistor 30 is adjusted so that ΔR is very small, but positive, a high Q inductance is obtained capable of serving as a passive component. If a capacitor is connected across the AC terminals of FIG. 1, under such circumstances, then a coilless tuned circuit results. Since the Q can be adjusted to be very high, the peak of the resonance curve (the curve of impedance versus frequency) may be very sharp. Therefore, a coilless tank circuit with a very high Q may be obtained which permits very sharp tuning. Such a circuit is shown in FIG. 4 which includes the various components illustrated in FIG. 1 for the condition just described wherein a variable capacitor 34 is provided across the AC terminals. It is also, of course, the case that a series resonant circuit may be provided by connecting a capacitor in series with it in which case the blocking capacitor 32 may not be needed.

Figure 5:
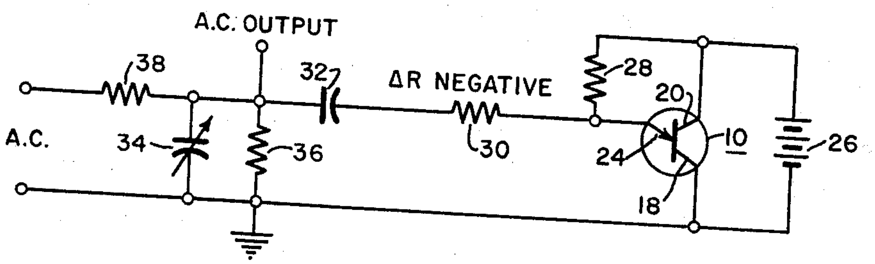
FIG. 5 is a circuit diagram of another circuit combination employing the inductive component of FIG. 1.

If the compensating resistor 30 is adjusted so that it does not entirely compensate for all the negative resistance of the unijunction transistor 10, then other useful circuits are possible. Such a circuit is shown in FIG. 5. This circuit is a coilless regenerative tuned amplifier and includes the components shown in FIG. 1 disposed in parallel with a tuning capacitor 34 and a load resistance 36. Series resistance 38 represents the output resistance of the AC signal source. Regenerative amplification is a result of the negative resistance of the unijunction transistor and it is here provided with tuning action which results from the inductance of the same device. For the regenerative tuned amplifier, it is a necessary condition that the total net resistance or conductance which includes the effect of the load resistor 36, the series resistor 38 and the net negative resistance (ΔR) be positive for the system to be stable. However, if this latter condition does not prevail, another useful circuit results in that the system becomes unstable and an output is produced without an input signal, hence, making possible a coilless sinusoidal oscillator.

With tuned circuits designed in accordance with the present invention, resonance has been obtained at a center frequency of 480 kilocycles with a 3 db bandwidth of 10 kilocycles and a Q of 48. These values are of course merely an example of what may be obtained in accordance with the present invention. As before mentioned, tuning of the inductance is possible by variation of the bias resistance or the voltage between the base contacts and inductance values as large as 8 millihenries and Q's as large as 250 have been achieved with good stability.

It is, of course, obvious that a semiconductor inductance may be used for many other applications than those shown herein.

Certain advantageous monolithic semiconductor devices may be formed which provide the function of a unijunction transistor and other elements, such as a bias resistor or a transistor amplifier, and such devices are described in my copending application Serial No. 94,867, filed March 10, 1961, and assigned to the same assignee as the present invention now Patent 3,271,639, issued September 6, 1966.

In view of the foregoing, the feasibility of realizing semiconductor inductors which exhibit values of inductance and sufficiently high Q's to be of practical use has been demonstrated. Such devices have been found obtainable without incurring problems of instability and noise.

While the present invention has been shown and described in certain forms only, it will be obvious to those skilled in the art that it is not so limited but is susceptible to various changes and modifications without departing from the spirit and scope thereof.

I claim as my invention:

1. A regenerative tuned amplifier comprising a semiconductor unijunction transistor, means to bias said unijunction transistor to an operating point in the negative resistance region of its current-voltage characteristic and means electrically coupled in series with said unijunction transistor having a positive resistance of a magnitude slightly less than the negative resistance of said unijunction transistor at said operating point, capacitive means and load means each connected in parallel with the negative resistance region of said unijunction transistor.

References Cited

UNITED STATES PATENTS

| | | | |
|---|---|---|---|
| 2,826,696 | 3/1958 | Suran | 307—88.5 |
| 2,879,482 | 3/1959 | Mathis et al. | 307—88.5 |
| 2,930,996 | 3/1960 | Chow et al. | 333—80 |
| 2,769,926 | 11/1956 | Lesk | 307—88.5 |
| 3,042,884 | 7/1962 | Ladany | 307—88.5 |

HERMAN KARL SAALBACH, *Primary Examiner.*

M. L. NUSSBAUM, *Assistant Examiner.*